(12) United States Patent
Joshi et al.

(10) Patent No.: US 10,896,865 B2
(45) Date of Patent: Jan. 19, 2021

(54) POWER ELECTRONICS MODULES INCLUDING AN INTEGRATED COOLING CHANNEL EXTENDING THROUGH AN ELECTRICALLY-CONDUCTIVE SUBSTRATE

(71) Applicant: Toyota Motor Engineering & Manufacturing North America, Inc., Plano, TX (US)

(72) Inventors: Shailesh N. Joshi, Ann Arbor, MI (US); Naoya Take, Canton, MI (US); Ercan Mehmet Dede, Ann Arbor, MI (US); Yanghe Liu, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 16/189,502

(22) Filed: Nov. 13, 2018

(65) Prior Publication Data

US 2020/0152548 A1    May 14, 2020

(51) Int. Cl.
    *H01L 23/473*    (2006.01)
    *H05K 7/20*    (2006.01)
    *H01L 23/373*    (2006.01)

(52) U.S. Cl.
    CPC ....... *H01L 23/473* (2013.01); *H05K 7/20927* (2013.01); *H01L 23/373* (2013.01)

(58) Field of Classification Search
    CPC .. H01L 23/473; H01L 23/373; H05K 7/20927
    See application file for complete search history.

(56) References Cited

U.S. PATENT DOCUMENTS

| 8,232,637 | B2 | 7/2012 | Beaupre et al. |
| 8,659,896 | B2 | 2/2014 | Dede et al. |
| 2006/0157858 | A1* | 7/2006 | Furman ................. H01L 23/473 257/762 |
| 2008/0224303 | A1* | 9/2008 | Funakoshi ............ H01L 23/051 257/701 |

(Continued)

FOREIGN PATENT DOCUMENTS

| CN | 203983257 U | 12/2014 |
| CN | 204922905 U | 12/2015 |

(Continued)

OTHER PUBLICATIONS https://www.researchgate.net/publication/301830758; Integrated Microchannel Cooling for Power Elect Wenli Zhang | Fengchang Yang | Rui Qiao | Dushan Boroyevichronic Modules Published/Accessed: May 2016, Journal: ResearchGate.

*Primary Examiner* — Michael Jung
(74) *Attorney, Agent, or Firm* — Dinsmore & Shohl LLP (57) ABSTRACT

A power electronics module includes a power electronics device, and an electrically-conductive substrate directly coupled to the power electronics device, the electrically-conductive substrate defining a plurality of channels extending through the electrically-conductive substrate, and a plurality of electrical pathways extending through the electrically-conductive substrate around the plurality of channels.

15 Claims, 6 Drawing Sheets

(56) References Cited

U.S. PATENT DOCUMENTS

| | | | | |
|---|---|---|---|---|
| 2010/0002399 A1* | 1/2010 | Mori | .................... | H01L 23/3735 |
| | | | | 361/719 |
| 2013/0062743 A1* | 3/2013 | Kim | .................... | H01L 23/3735 |
| | | | | 257/675 |
| 2014/0117508 A1* | 5/2014 | Nishi | .................. | H01L 23/3735 |
| | | | | 257/622 |
| 2015/0028448 A1* | 1/2015 | Hosseini | .................. | H01L 24/24 |
| | | | | 257/531 |
| 2016/0035660 A1* | 2/2016 | Terasaki | .................. | B32B 15/01 |
| | | | | 174/252 |
| 2019/0019756 A1* | 1/2019 | Yu | ........................ | H01L 23/5226 |
| 2019/0295982 A1* | 9/2019 | Hu | .......................... | H01L 21/56 |
| 2020/0066612 A1* | 2/2020 | Hung | .................. | H01L 23/3675 |
| 2020/0185299 A1* | 6/2020 | Chang | ............... | H01L 23/49827 |

FOREIGN PATENT DOCUMENTS

| | | | |
|---|---|---|---|
| JP | 2004259791 A | | 9/2004 |
| WO | 2013091143 A1 | | 6/2013 |

* cited by examiner

POWER ELECTRONICS MODULES INCLUDING AN INTEGRATED COOLING CHANNEL EXTENDING THROUGH AN ELECTRICALLY-CONDUCTIVE SUBSTRATE

FIELD

The present specification generally relates to apparatuses for cooling power electronics devices and, more specifically, to power electronics modules including an electrically-conductive substrate with integrated cooling.

TECHNICAL BACKGROUND

Heat sink devices may be coupled to a heat-generating device, such as a power electronics device, to remove heat and lower the operating temperature of the heat-generating device. Cooling fluid may be used to receive heat generated by the heat-generating device by convective and/or conductive thermal transfer, and may remove heat from the heat-generating device.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels. Accordingly, a need exists for alternative heat exchangers and methods to cool heat-generating devices.

SUMMARY

In one embodiment, a power electronics module includes a power electronics device, and an electrically-conductive substrate directly coupled to the power electronics device, the electrically-conductive substrate defining a plurality of channels extending through the electrically-conductive substrate, and a plurality of electrical pathways extending through the electrically-conductive substrate around the plurality of channels.

In another embodiment, a power electronics module includes an electrically-conductive substrate defining an upper substrate surface facing upward in a vertical direction a lower substrate surface positioned opposite the upper substrate surface and facing downward in the vertical direction, an inlet face positioned between the upper substrate surface and the lower substrate surface in the vertical direction, an outlet face positioned opposite the inlet face and positioned between the upper substrate surface and the lower substrate surface in the vertical direction, a plurality of channels extending through the electrically-conductive substrate between the inlet face and the outlet face, and a power electronics device coupled to the upper substrate surface and electrically coupled to the lower substrate surface of the electrically-conductive substrate through the upper substrate surface.

In yet another embodiment, a method for cooling a power electronics device, the method includes passing an electrical current between the power electronics device and an electrically-conductive substrate directly coupled to the power electronics device, transmitting the electrical current through an electrical pathway within the electrically-conductive substrate, where the electrical pathway extends around a channel extending through the electrically-conductive substrate, and passing a cooling fluid through the channel of the electrically-conductive substrate.

Additional features of the power electronics modules and methods for cooling power electronics modules described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Reference will now be made in detail to embodiments of power electronics modules and methods of operating the same, examples of which are illustrated in the accompanying drawings. Whenever possible, the same reference numerals will be used throughout the drawings to refer to the same or like parts.

Embodiments described herein are directed to heat-generating devices and methods for cooling the heat-generating devices. The heat-generating devices may include, as one example, power electronics modules including a power electronics device. The power electronics device generally generates heat during operation that should be dissipated. Cooling fluid may be utilized to dissipate the heat, and it is generally desirable to position the cooling fluid as close as possible to the power electronics device to increase the efficiency of the cooling fluid in dissipating heat from the power electronics device. Embodiments described herein are directed to power electronics modules that are configured to allow cooling fluid to be passed through an electrically-conductive substrate coupled to the power electronics device such that the cooling fluid is positioned as close to the power electronics device as possible without intervening insulating components.

In particular, embodiments described herein are directed to power electronics modules including an electrically-conductive substrate and a power electronics device coupled to the electrically-conductive substrate. The electrically-conductive substrate generally includes a plurality of channels extending there through. Cooling fluid may be passed through the plurality channels to remove thermal energy generated by the power electronics device, and the electrically-conductive substrate may also serve as a collector electrode electrically coupled to the power electronics device. Because the electrically-conductive substrate can simultaneously provide cooling to the power electronics device and serve as a collector electrode electrically coupled to the power electronics device, the cooling fluid may be positioned closer to the power electronics device as compared to conventional power electronics modules, which may generally include additional intervening components between the power electronics device and the cooling fluid. Various embodiments of power electronics modules and methods for operating the same will be described herein with specific reference to the appended drawings.

As used herein, the term "longitudinal direction" refers to the forward-rearward direction of the power electronics module (i.e., in the +/− X-direction as depicted). The term "lateral direction" refers to the cross-direction of the power electronics module (i.e., in the +/− Y-direction as depicted), and is transverse to the longitudinal direction. The term "vertical direction" refers to the upward-downward direction of the power electronics module (i.e., in the +/− Z-direction as depicted), and is transverse to the lateral and the longitudinal directions.

Figure 1:
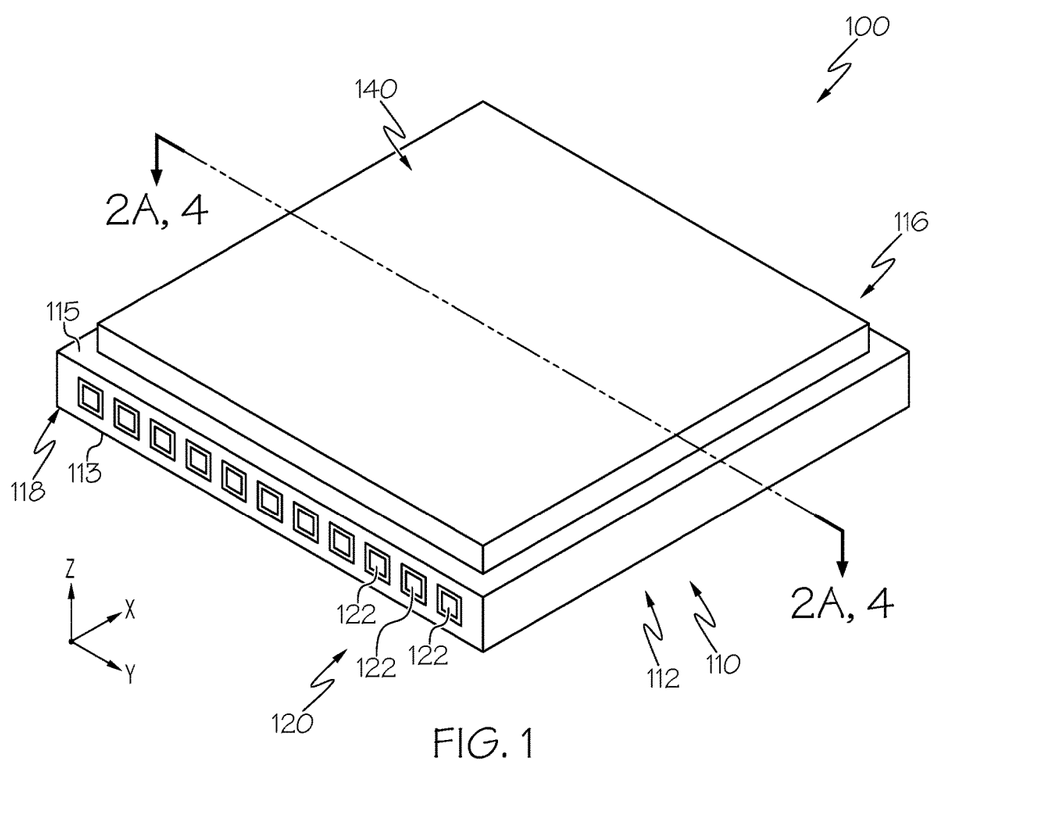
FIG. 1 schematically depicts a perspective view of a power electronics module, according to one or more embodiments shown and described herein.

Referring initially to FIG. 1, a perspective view of an example power electronics module 100 is schematically depicted. The power electronics module 100 generally includes a power electronics device 140 electrically coupled to a collector electrode 110.

The power electronics module 100 may be one or more semiconductor devices that may include, without limitation, an insulated-gate bipolar transistor (IGBT), a reverse conducting IGBT (RC-IGBT), a metal-oxide-semiconductor field-effect transistor (MOSFET), a power MOSFET, diodes, transistors, and/or combinations thereof (e.g., power cards). In some embodiments, the power electronics device 140 may include a wide-bandgap semiconductor, and may be formed from any suitable material, for example and without limitation diamond, silicon carbide (SiC), or the like.

The power electronics module 100 may be used in a vehicular electrical system, for example as part of an inverter system in an electric or hybrid-electric vehicle. In vehicular applications, the power electronics devices 140 may generate significant heat flux and the generated heat should be dissipated to maintain the power electronics devices 140 at a suitable operating temperature. While the power electronics modules 100 described herein are generally described as being utilized in a vehicular electrical system, it should be understood that the power electronics modules 100 may also be utilized in any other suitable application.

In the embodiment depicted in FIG. 1, the collector electrode 110 is an electrically-conductive substrate 112. The electrically-conductive substrate 112 defines an inlet face 118 and an outlet face 116 positioned opposite the inlet face 118 in the longitudinal direction. The electrically-conductive substrate 112 further defines a plurality of channels 120 extending through the electrically-conductive substrate 112 in the longitudinal direction between the inlet face 118 and the outlet face 116. In the embodiment depicted in FIG. 1, individual channels 122 of the plurality of channels 120 are linearly arranged, with each of the individual channels 122 spaced apart from one another in the lateral direction. However, it should be understood that the individual channels 122 of the plurality of channels 120 may be arranged in any suitable manner extending through the electrically-conductive substrate 112 in the longitudinal direction. Additionally, while the plurality of channels 120 are schematically depicted as defining a rectangular shaped cross-section extending through the electrically-conductive substrate 112, it should be understood that the plurality of channels 120 may define any suitable shape extending through the electrically-conductive substrate 112. For example and without limitation, the plurality of channels 120 may define a cross-section having an elliptical shape, a circular shape, a polygonal shape, a serpentine shape, or the like extending through the electrically-conductive substrate 112. In embodiments, the electrically-conductive substrate 112 is formed of an electrically conductive material, such as copper, a copper alloy, or the like.

Figure 2A:
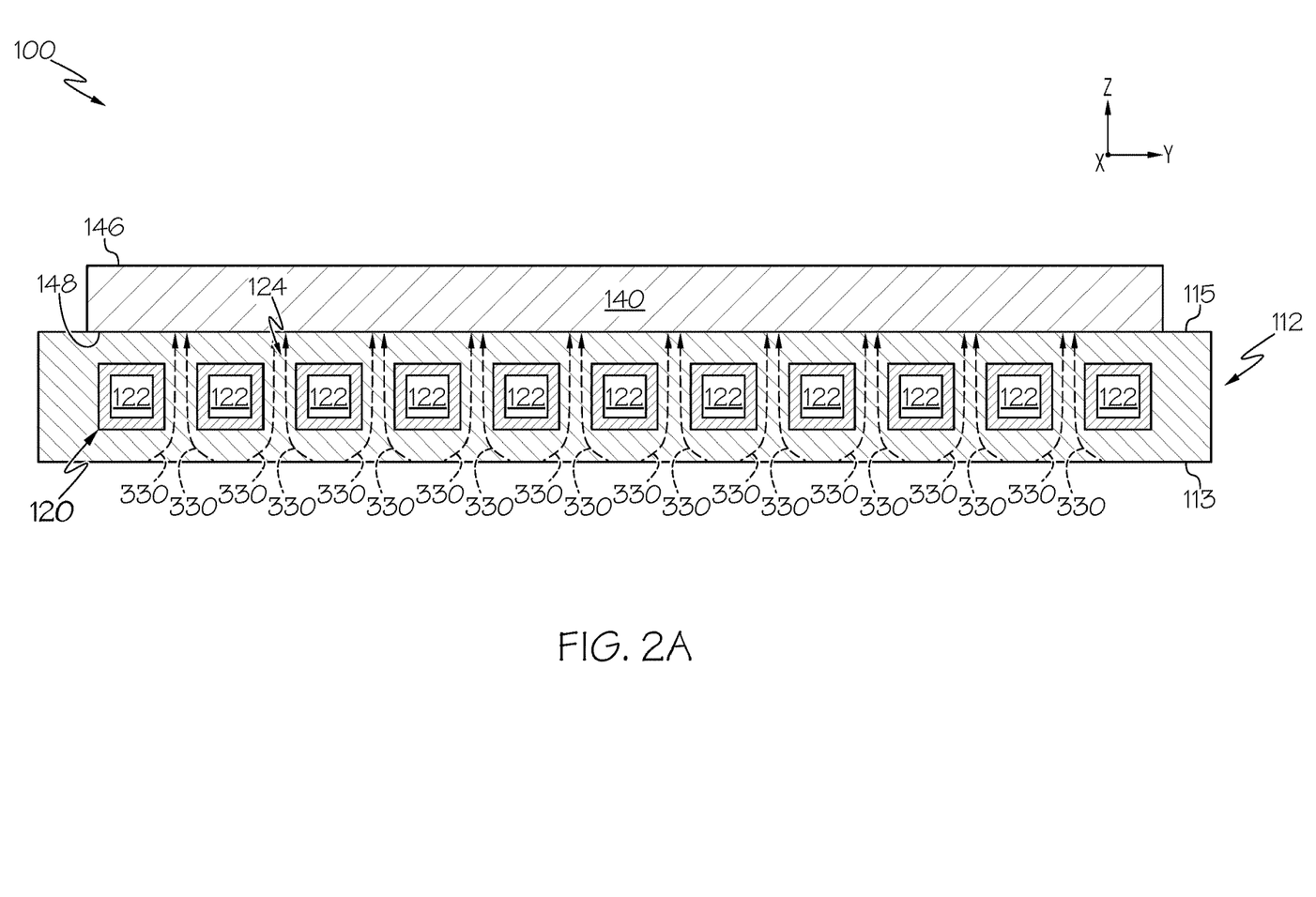
FIG. 2A schematically depicts a section view of the power electronics module of FIG. 1 along section 2A-2A, according to one or more embodiments shown and described herein.

Referring to FIG. 2A, a section view of the power electronics module 100 along section 2A-2A of FIG. 1 is schematically depicted. The power electronics device 140 generally defines a power electronics upper surface 146 oriented to face upwards in the vertical direction, and a power electronics lower surface 148 that is positioned opposite the power electronics upper surface 146 and that is oriented to face downwards in the vertical direction. As noted above, the plurality of channels 120 of the electrically-conductive substrate 112 extend through the electrically-conductive substrate 112 in the longitudinal direction and is generally aligned with the power electronics lower surface 148.

The electrically-conductive substrate 112 generally defines a substrate lower surface 113 oriented to face downward in the vertical direction, and a substrate upper surface 115 positioned opposite the substrate lower surface 113 and oriented to face upward in the vertical direction. In some embodiments, the electrically-conductive substrate 112 is formed as a single, solid layer. The inlet face 118 (FIG. 1) and the outlet face 116 (FIG. 1) are generally positioned between the substrate lower surface 113 and the substrate upper surface 115 in the vertical direction. In embodiments, the substrate lower surface 113 and the substrate upper surface 115 may be oriented transverse to the inlet face 118 (FIG. 1) and the outlet face 116 (FIG. 1) such that the electrically-conductive substrate 112 generally forms a rectangular prism. However, it should be understood that the electrically-conductive substrate 112 may form any suitable shape including the plurality of channels 120 extending through the electrically-conductive substrate 112 in the longitudinal direction.

In the embodiment depicted in FIG. 2A, the power electronics lower surface 148 is coupled to the substrate upper surface 115 to couple the power electronics device 140 to the electrically-conductive substrate 112. In embodiments, the power electronics device 140 is directly coupled to the electrically-conductive substrate 112, such that there are no intervening components or layers positioned between the power electronics device 140 and the electrically-conductive substrate 112. In these embodiments, the power electronics device 140 may be directly coupled to the electrically-conductive substrate 112 through a soldered connection, a sintered connection, a transient liquid phase (TLP) soldered connection, a brazed connection, or the like. The power electronics device 140 is also electrically coupled to the electrically-conductive substrate 112 such that electrical current may be passed between the power electronics device 140 and the electrically-conductive substrate 112, as described in greater detail herein.

The electrically-conductive substrate 112 defines a plurality of electrical pathways 130 extending throughout the electrically-conductive substrate 112. Generally, the plurality of electrical pathways 130 extend throughout the electrically-conductive substrate 112 and around the channels 122 of the plurality of channels 120, electrically coupling the substrate upper surface 115 and the substrate lower surface 113. For example and as shown in FIG. 2A, the plurality of electrical pathways 130 may extend in the vertical direction between the substrate upper surface 115 and the substrate lower surface 113 around the plurality of channels 120. While the electrical pathways 130 are depicted as extending in the vertical direction, it should be understood that the electrical pathways 130 may also extend in the lateral and the longitudinal directions throughout the electrically-conductive substrate 112.

Figure 2B:
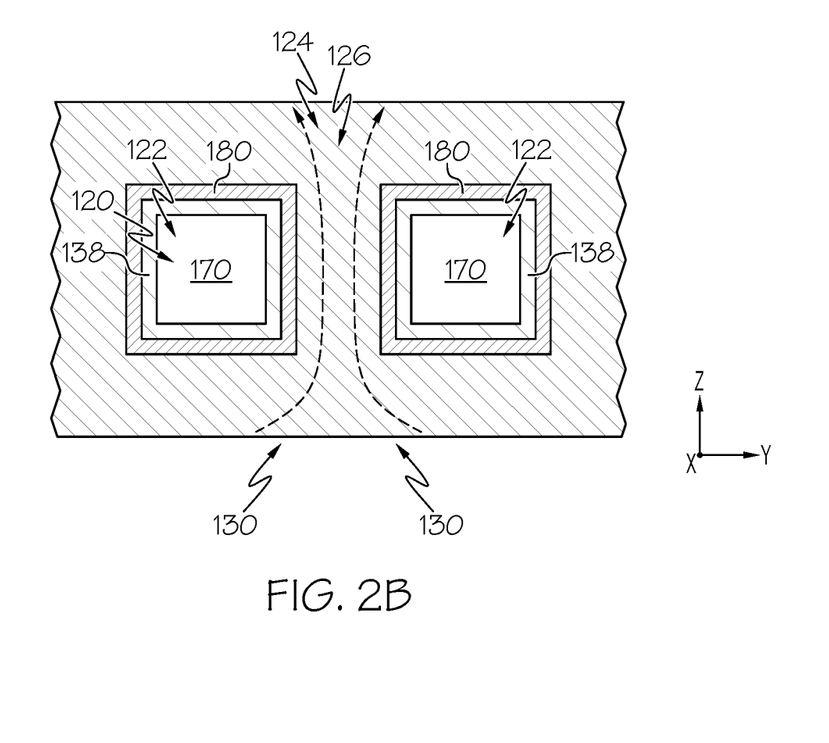
FIG. 2B schematically depicts an enlarged view of adjacent channels extending through an electrically-conductive substrate of the power electronics module of FIG. 2A, according to one or more embodiments shown and described herein.

Referring to FIG. 2B, an enlarged view of adjacent channels 122 of the plurality of channels 120 is schematically depicted. The electrically-conductive substrate 112 generally defines a plurality of walls 124, where individual walls 126 of the plurality of walls 124 are positioned between and define the individual channels 122 of the plurality of channels 120. The plurality of walls 124 also define the plurality of electrical pathways 130 extending between the substrate upper surface 115 and the substrate lower surface 113. The size and shape of the individual walls 126 of the plurality of walls 124 impact the flow of current through the plurality of walls 124 along the plurality of electrical pathways 130, and impact the amount of thermal energy that may be transferred between the plurality of walls 124 and a cooling fluid positioned within the plurality of channels 120. Accordingly, the width of the walls 124 evaluated between adjacent channels 122 may be selected to attain desired cooling and conductivity performance of the electrically-conductive substrate 112. In one embodiment, individual walls 126 of the plurality of walls 124 define a wall width evaluated between adjacent channels 122 that is between 200 micrometers and 300 micrometers, inclusive of the endpoints. In other embodiments, the individual walls 126 of the plurality of walls 124 define a wall width evaluated between adjacent channels 122 that is about 250 micrometers.

In some embodiments, the plurality of walls 124 is integral with the substrate upper surface 115 (FIG. 2A) and the substrate lower surface 113 (FIG. 2A), such that the electrically-conductive substrate 112 is a single, solid member. In such embodiments, the plurality of walls 124 may be formed through a subtractive machining process or an additive manufacturing process. For example, in some embodiments, the plurality of walls may be formed through a Lithographie, Galvanoformung, Abformung (LIGA) machining process, or other suitable process. In other embodiments, the plurality of walls 124 may be formed in an additive process, such as by three-dimensional printing, electrodepositing, or the like. In other embodiments, the plurality of walls 124 may be coupled to the substrate upper surface 115 (FIG. 2A) and the substrate lower surface 113 (FIG. 2A).

In embodiments, the channels 122 each define an interior region 170 bounded by the channel 122. In embodiments, the power electronics module 100 further includes an electrically-insulating layer 138 bounding the interior regions 170 of the plurality of channels 120. The electrically-insulating layer 138 is formed from an electrically-insulating material that inhibits the transmission of electrical current through the electrically-insulating layer 138, such as and without limitation, aluminum oxide, phosphate, parylene, or the like. In embodiments, the electrically-insulating layer 138 may have a thickness of less than 1 micrometer and may be deposited on the electrically-conductive substrate 112 through a suitable deposition process, such as atomic layer deposition, chemical vapor deposition, or the like.

The electrically-insulating layer 138 may generally insulate the plurality of electrical pathways 130, such that electrical current may not be passed from the plurality of electrical pathways 130 to the interior regions 170 of the plurality of channels 120. However, as noted above, the electrically-insulating layer 138 may have a small thickness (e.g., less than about 1 micrometer). The relatively small thickness of the electrically-insulating layer 138 may allow thermal energy to be passed from the electrically-conductive substrate 112 through the electrically-insulating layer 138. For example, thermal energy may pass through the electrically-insulating layer 138 to a cooling fluid positioned in the interior regions 170 of the plurality of channels 120.

Figure 3:
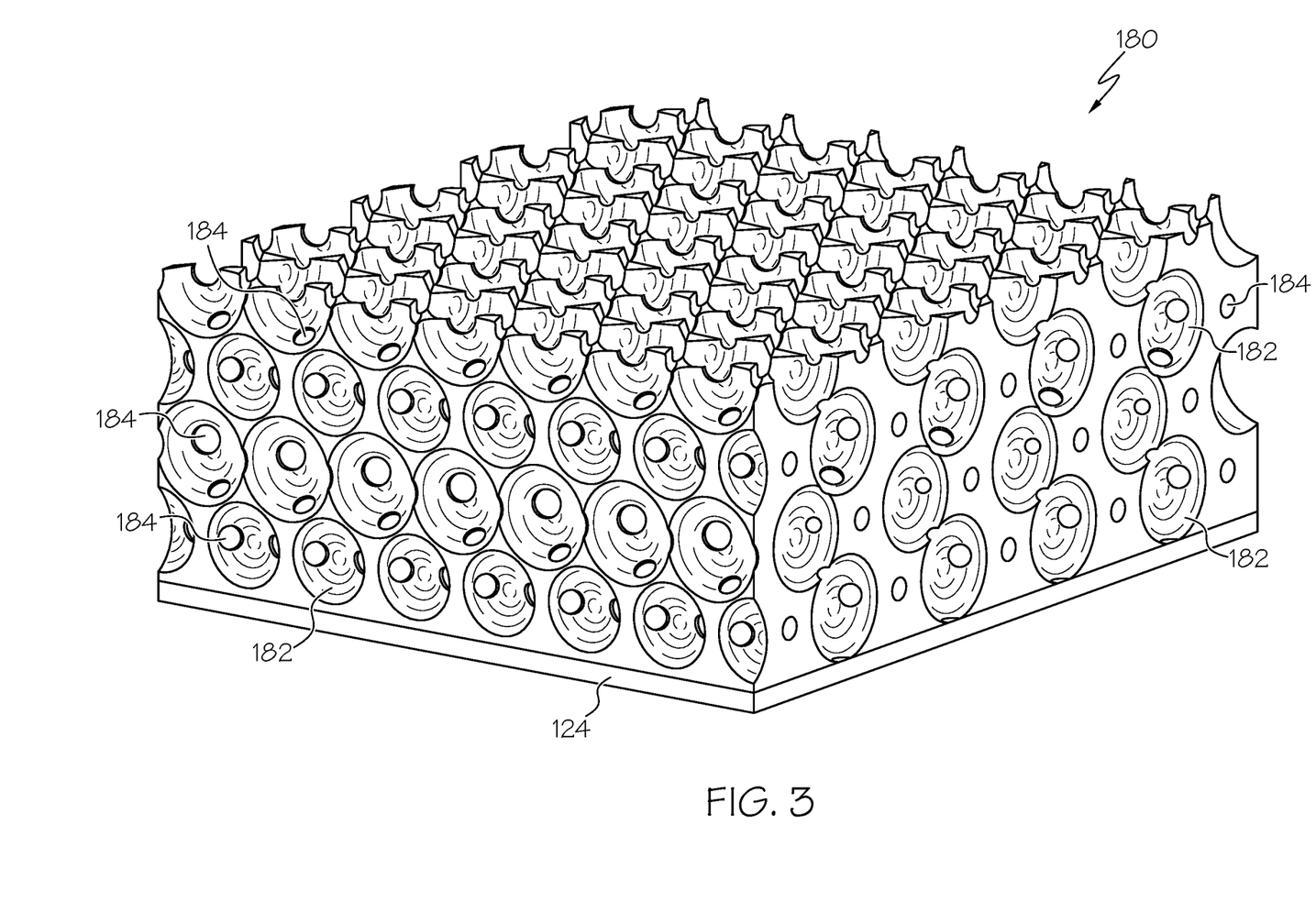
FIG. 3 schematically depicts an enlarged view of a porous coating positioned on the channels of the electrically-conductive substrate of the power electronics module of FIG. 2A, according to one or more embodiments shown and described herein.

Referring collectively to FIGS. 2B and 3, in some embodiments, the power electronics module 100 may include a porous coating 180 positioned on the plurality of walls 124, which may assist in transferring thermal energy from the electrically-conductive substrate 112 to cooling fluid positioned within the channels 122. In some embodiments, the porous coating 180 may be any inverse opal structure, such as, for example, a metal inverse opal (MIO) structure (e.g., a copper inverse opal (CIO) structure, a nickel inverse opal (NIO) structure, or the like) or the like. As depicted, the porous coating 180 may have a plurality of dimples 182 (or other similar depression or indentation) and a plurality of networked pores 184 extending throughout the porous coating 180 such that cooling fluid can flow through each of the plurality of networked pores 184 and contact a greater amount of surface area for the purposes of heat transfer. While the dimples 182 and the pores 184 are specifically shown and described herein, the porous coating 180 may include other surface features that increase heat transfer without departing from the scope of the present disclosure. In embodiments, the porous coating 180 may assist in transferring thermal energy from the electrically-conductive substrate 112 to a cooling fluid in the channels 122. In some embodiments, the electrically-insulating layer 138 is positioned on the porous coating 180 (e.g., over an outer surface of the dimples 182 and an outer surface of the pores 184) to electrically insulate the porous coating 180. In other embodiments, the porous coating 180 may be positioned over the electrically-insulating layer 138, such that the electrically-insulating layer 138 is positioned between the porous coating 180 and plurality of walls 124. While the embodiment depicted in FIGS. 2B and 3 depict a porous coating 180 including an inverse opal structure, it should be understood that the porous coating 180 may include any suitable surface texture to assist in transferring thermal energy from the electrically-conductive substrate 112 to a cooling fluid. For example, in some embodiments, the porous coating 180 may be formed of a sintered coating or the like.

Referring again to FIGS. 2A and 2B, in operation, electrical current is passed between the power electronics device 140 and the electrically-conductive substrate 112, and through the electrical pathways 130 between the substrate upper surface 115 and the substrate lower surface 113. Thermal energy is also passed between the power electronics device 140 and the electrically-conductive substrate 112, as the electrically-conductive substrate 112 may be directly coupled to the power electronics device 140. To remove thermal energy from the electrically-conductive substrate 112, cooling fluid is passed through the plurality of channels 120. More particularly, cooling fluid is passed from the inlet end 118 (FIG. 1), through the plurality of channels 120, to the outlet end 116 (FIG. 1) of the electrically-conductive substrate 112. In embodiments, one or more manifolds may be connected to the inlet end 118 (FIG. 1) and the outlet end 116 (FIG. 1), and a pump may drive the cooling fluid through the plurality of channels 120. Subsequent to passing through the plurality of channels 120, the cooling fluid may pass thorough a heat exchanger to cool the cooling fluid, and then the cooling fluid may be passed through the plurality of channels 120 again.

As described above, in some embodiments, the electrically-insulating layer 138 electrically insulates the interior regions 170 of the plurality of channels 120. Because the electrically-insulating layer 138 insulates the electrically-conductive substrate from the cooling fluid, cooling fluid may be utilized directly within the electrically-conductive substrate 112 itself, as compared to conventional configurations. For example, in conventional configurations, cooling fluid may be spaced apart from the electrically-conductive substrate 112 by one or more intervening and insulating components, so that the cooling fluid may be sufficiently insulated from the electrically-conductive substrate 112. However, by spacing the cooling fluid apart from the electrically-conductive substrate, the cooling fluid is necessarily spaced apart from the power electronics device 140, thereby reducing the effectiveness of the cooling fluid at absorbing thermal energy from the power electronics device 140.

By contrast, the electrically-conductive substrate 112 includes the electrically-insulating layer 138 on the plurality of channels 120, allowing cooling fluid to be passed directly through the electrically-conductive substrate 112. As the cooling fluid may be incorporated with the electrically-conductive substrate 112, heat flux from the power electronics device 140 may be more effectively transferred to the cooling fluid, as compared to conventional configurations.

As the electrically-insulating layer 138 generally insulates the interior regions 170 of the plurality of channels 120, in some embodiments, the cooling fluid may be formed from an electrically-conductive fluid, such as an ethylene glycol mixture, water, or the like. In other embodiments, a non-electrically conductive, dielectric cooling fluid may be passed through the plurality of channels 120.

Figure 4:
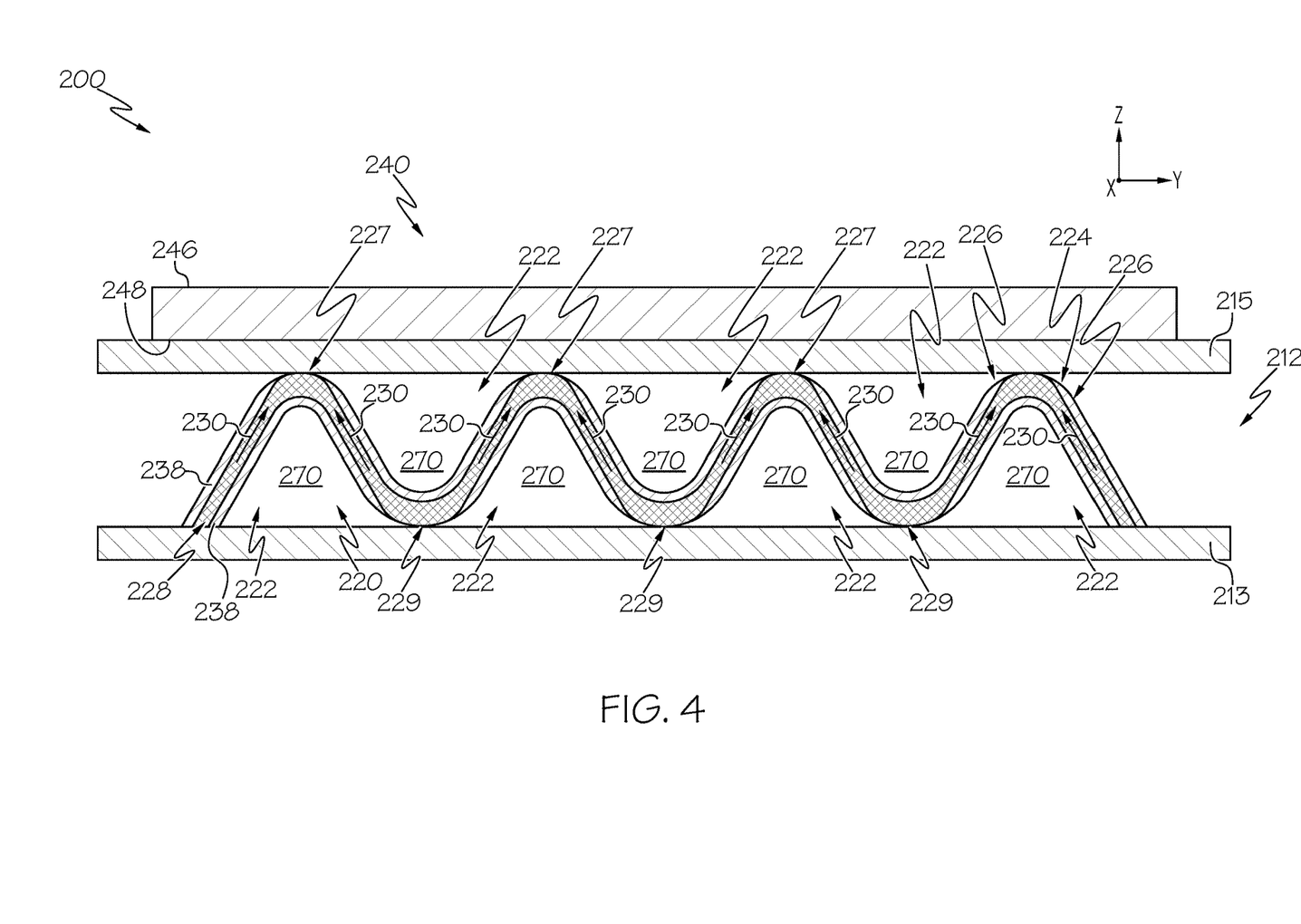
FIG. 4 schematically depicts a section of another power electronics module, according to one or more embodiments shown and described herein.

Referring to FIG. 4, a section view of another embodiment of the power electronics module 200 is depicted along section 4-4 of FIG. 1. In the embodiment depicted in FIG. 4, the power electronics module 200 includes the electrically-conductive substrate 212 including the upper substrate surface 215 and the lower substrate surface 213.

However, in the embodiment depicted in FIG. 4, the individual walls 226 of the plurality of walls 224 are formed by a serpentine member 228 coupled to the upper substrate surface 215 and the lower substrate surface 213. The serpentine member 228 includes a plurality of upper crests 227 that are electrically coupled to the upper substrate surface 215 and a plurality of lower crests 229 that are electrically coupled to the lower substrate surface 213. The plurality of electrical pathways 230 may extend between the plurality of upper crests 227 and the plurality of lower crests 229 of the serpentine member 228 to electrically couple the upper substrate surface 215 to the lower substrate surface 213.

The serpentine member 228 may be formed through any suitable process, and may be formed of any suitable material. For example, in some embodiments, the serpentine member 228 is formed from copper, a copper alloy, or the like, and may be formed of the same or a different material than the lower substrate surface 213 and the upper substrate surface 215. In embodiments, the serpentine member 228 may be formed through a subtractive machining process or an additive manufacturing process. For example, in some embodiments, the plurality of walls may be formed through a LIGA machining process, a stamping process, an extrusion process, or other suitable process. In other embodiments, the serpentine member 228 may be formed in an additive process, such as by three-dimensional printing, electrode-positing, or the like.

The electrically-insulating layer 238 may be positioned on the serpentine member 228 to electrically insulate the plurality of electrical pathways 230 extending through the serpentine member 228. In some embodiments, the porous coating 180 (FIG. 2B) may be positioned on the serpentine member 228, and the electrically-insulating layer 238 may be positioned over and/or under the porous coating to electrically insulate the plurality of electrical pathways 230 extending through the serpentine member 228. In this way, similar to the embodiment described above and depicted in FIG. 2B, a cooling fluid passing through the plurality of channels 220 may be electrically insulated from the electrical pathways 230.

Figure 5:
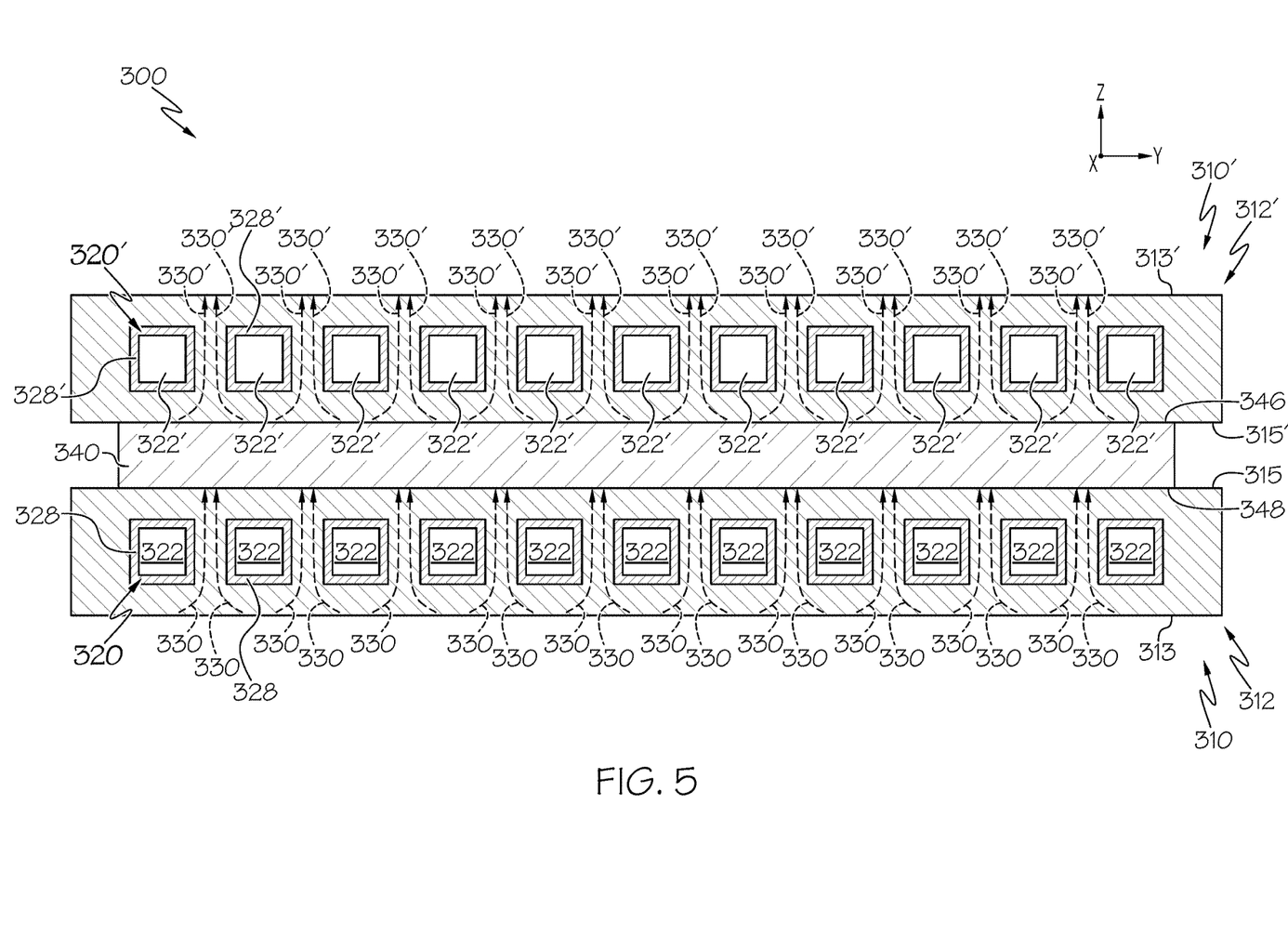
FIG. 5 schematically depicts a section view of another power electronics module, according to one or more embodiments shown and described herein.

Referring to FIG. 5, a section view of another embodiment of a power electronics module 300 is schematically depicted. In the embodiment depicted in FIG. 5, the power electronics module 300 includes the power electronics device 340 including the power electronics upper surface 346 and the power electronics lower surface 348. The power electronics module 300 further includes the collector electrode 310 including the electrically-conductive substrate 312 with the plurality of channels 320. Like the embodiment discussed above and depicted in FIG. 2B, the plurality of channels 320 includes individual channels 322 laterally spaced apart from one another, and each of the individual channels 322 include an electrically-insulating layer 328 bounding the individual channels 322. The electrically-conductive substrate 312 further defines the plurality of electrical pathways 330 extending around the individual channels 322.

However, in the embodiment depicted in FIG. 5, the collector electrode 310 is a collector electrode 310, and the power electronics module 300 further includes an emitter electrode 310'. In particular, the power electronics module 300 includes the emitter electrode 310', which is a second electrically-conductive substrate 312' directly coupled to the power electronics upper surface 346. In embodiments, the second electrically-conductive substrate 312' is substantially the same as the first electrically-conductive substrate 312, and includes the plurality of channels 320' extending through the second electrically-conductive substrate 312'. The plurality of channels 320' of the second electrically-conductive substrate 312' include the individual channels 322' laterally spaced from one another, and each of the individual channels 322' include an electrically-insulating layer 328' bounding the individual channels 322'. The second electrically-conductive substrate 312' may further be electrically coupled to the power electronics device 340, and may define electrical pathways 330' extending around the individual channels 322'.

In operation, cooling fluid may be passed through the channels 322, 322' of both the first and the second electrically-conductive substrates 312, 312' as described above. Because the power electronics module 300 includes both the first and the second electrically-conductive substrate 312, 312' including the channels 322, 322', coolant may be directed over both the power electronics upper surface 346 (e.g., via the second electrically-conductive substrate 322') and the power electronics lower surface 348 (e.g., via the first electrically-conductive substrate 322). By directing cooling fluid over both the power electronics upper surface 346 and the power electronics lower surface 348, the thermal energy that may be transferred from the power electronics device 340 to the cooling fluid may be increased.

Accordingly, it should now be understood that embodiments described herein are directed to power electronics modules including an electrically-conductive substrate and a power electronics device coupled to the electrically-conductive substrate. The electrically-conductive substrate generally includes a plurality of channels extending there through. Cooling fluid may be passed through the plurality channels to remove thermal energy generated by the power electronics device. The electrically-conductive substrate may also serve as a collector electrode electrically coupled to the power electronics device. Because the electrically-conductive substrate can simultaneously provide cooling to the power electronics device and serve as a collector electrode electrically coupled to the power electronics device, the cooling fluid may be positioned closer to the power electronics device as compared to conventional power electronics modules.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A power electronics module comprising:
a power electronics device; and
an electrically-conductive substrate directly contacting the power electronics device, wherein the electrically-conductive substrate defines a collector electrode electrically coupled to the power electronics device, the electrically-conductive substrate defining:
a plurality of channels extending through the electrically-conductive substrate; and
a plurality of electrical pathways extending through the electrically-conductive substrate around the plurality of channels.

2. The power electronics module of claim 1, wherein the plurality of channels extend through the electrically-conductive substrate in a longitudinal direction, and the plurality of electrical pathways extend through the electrically-conductive substrate in a direction that is transverse to the longitudinal direction.

3. The power electronics module of claim 1, wherein the power electronics device defines a power electronics lower surface directly coupled to the electrically-conductive substrate, and wherein the plurality of channels extends in a direction aligned with the power electronics lower surface of the power electronics device.

4. The power electronics module of claim 1, wherein the electrically-conductive substrate defines a plurality of walls that are positioned between individual channels of the plurality of channels and that define the plurality of electrical pathways.

5. The power electronics module of claim 4, wherein the electrically-conductive substrate further comprises an upper substrate surface and a lower substrate surface positioned opposite the upper substrate surface, wherein the plurality of walls are integral with the upper substrate surface and the lower substrate surface.

6. The power electronics module of claim 4, wherein the electrically-conductive substrate further comprises an upper substrate surface, a lower substrate surface positioned opposite the upper substrate surface, and a serpentine member coupled to the upper substrate surface and the lower substrate surface, the serpentine member defining the plurality of channels.

7. The power electronics module of claim 1, wherein each of the plurality of channels define an interior region bounded by the plurality of channels, and the power electronics module further comprises an electrically-insulating layer bounding the interior regions of the plurality of channels.

8. The power electronics module of claim 7, wherein the electrically-insulating layer bounding each of the interior regions defines a thickness that is less than 1 micrometer.

9. The power electronics module of claim 1, wherein each of the plurality of channels define an interior region bounded by the plurality of channels, and the power electronics module further comprises a porous coating bounding the interior regions of the plurality of channels.

10. A power electronics module comprising:
an electrically-conductive substrate defining:
an upper substrate surface facing upward in a vertical direction;
a lower substrate surface positioned opposite the upper substrate surface and facing downward in the vertical direction;
an inlet face positioned between the upper substrate surface and the lower substrate surface in the vertical direction;
an outlet face positioned opposite the inlet face and positioned between the upper substrate surface and the lower substrate surface in the vertical direction;
a plurality of channels extending through the electrically-conductive substrate between the inlet face and the outlet face; and
a power electronics device coupled to the upper substrate surface and electrically coupled to the lower substrate surface of the electrically-conductive substrate through the upper substrate surface, wherein the electrically-conductive substrate directly contacts the power electronics device.

11. The power electronics module of claim 10, wherein the electrically-conductive substrate comprises plurality of walls extending between the upper substrate surface and the lower substrate surface, wherein individual walls of the plurality of walls are positioned between individual channels of the plurality of channels and electrically couple the upper substrate surface to the lower substrate surface.

12. The power electronics module of claim 11, wherein the plurality of walls are integral with the upper substrate surface and the lower substrate surface.

13. The power electronics module of claim 11, wherein the electrically-conductive substrate further comprises a serpentine member that defines the plurality of walls, the serpentine member comprising a plurality of upper crests that are electrically coupled to the upper substrate surface and a plurality of lower crests electrically coupled to the lower substrate surface.

14. The power electronics module of claim 11, wherein each of the plurality of channels define an interior region bounded by the plurality of walls, and the power electronics module further comprises an electrically-insulating layer bounding the interior region of the plurality of channels.

15. The power electronics module of claim 10, wherein the electrically-conductive substrate defines a collector electrode electrically coupled to the power electronics device.

* * * * *